US008872222B2

(12) United States Patent
Chan et al.

(10) Patent No.: US 8,872,222 B2
(45) Date of Patent: Oct. 28, 2014

(54) SEMICONDUCTOR STRUCTURE AND METHOD FOR FORMING THE SAME

(75) Inventors: Ching-Lin Chan, Huwei Township, Yunlin County (TW); Chen-Yuan Lin, Taitung (TW); Cheng-Chi Lin, Toucheng Township, Yilan County (TW); Shih-Chin Lien, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/405,001

(22) Filed: Feb. 24, 2012

(65) Prior Publication Data
US 2013/0221404 A1 Aug. 29, 2013

(51) Int. Cl.
*H01L 29/739* (2006.01)
*H01L 21/331* (2006.01)

(52) U.S. Cl.
USPC ............ 257/140; 257/47; 257/197; 257/205; 257/351; 257/370; 257/373; 257/378; 257/423; 257/427; 257/474; 257/477; 257/511; 257/517; 257/525; 257/E21.382; 438/135

(58) Field of Classification Search
USPC ............... 257/140, 13, 47, 97, 205, 351, 370, 257/373, 378, 423, 427, 474, 477, 511, 517, 257/525
See application file for complete search history.

(56) References Cited

U.S. PATENT DOCUMENTS

2011/0140201 A1* 6/2011 Lin et al. ............... 257/342
2012/0280316 A1* 11/2012 Lin et al. ............... 257/335

* cited by examiner

*Primary Examiner* — Zandra Smith
*Assistant Examiner* — Damian A Hillman
(74) *Attorney, Agent, or Firm* — McClure, Qualey & Rodack, LLP

(57) ABSTRACT

A semiconductor structure and a method for forming the same are provided. The semiconductor structure comprises a first doped region, a second doped region, a doped strip and a top doped region. The first doped region has a first type conductivity. The second doped region is formed in the first doped region and has a second type conductivity opposite to the first type conductivity. The doped strip is formed in the first doped region and has the second type conductivity. The top doped region is formed in the doped strip and has the first type conductivity. The top doped region has a first sidewall and a second sidewall opposite to the first sidewall. The doped strip is extended beyond the first sidewall or the second sidewall.

15 Claims, 9 Drawing Sheets

US 8,872,222 B2

SEMICONDUCTOR STRUCTURE AND METHOD FOR FORMING THE SAME

BACKGROUND

1. Technical Field

The disclosure relates in general to a semiconductor structure and a method for forming the same, and more particularly to a HV semiconductor device and a method for forming the same.

2. Description of the Related Art

In the semiconductor technology, the feature size has been reduced. In the meantime, the rate, the efficiency, the density and the cost per integrated circuit unit have been improved. In a method for increasing an operating voltage in a conventional device, for example, field plate regions having the same surface profile and different depth ranges are formed on a drift region by using the same mask. However, reduction of the resistance and increase of the on-state current of the device by this kind of method are still limited.

SUMMARY

A semiconductor structure is provided. The semiconductor structure comprises a first doped region, a second doped region, a doped strip and a top doped region. The first doped region has a first type conductivity. The second doped region is formed in the first doped region and has a second type conductivity opposite to the first type conductivity. The doped strip is formed in the first doped region and has the second type conductivity. The top doped region is formed in the doped strip and has the first type conductivity. The top doped region has a first sidewall and a second sidewall opposite to the first sidewall. The doped strip is extended beyond the first sidewall or the second sidewall.

A method for forming a semiconductor structure is provided. The method comprises following steps. A second doped region is formed in a first doped region. The first doped region has a first type conductivity. The second doped region has a second type conductivity opposite to the first type conductivity. A doped strip is formed in the first doped region. The doped strip has the second type conductivity. A top doped region is formed in the doped strip. The top doped region has the first type conductivity. The top doped region has a first sidewall and a second sidewall opposite to the first sidewall. The doped strip is extended beyond the first sidewall or the second sidewall.

DETAILED DESCRIPTION

First Embodiment

Figure 2:
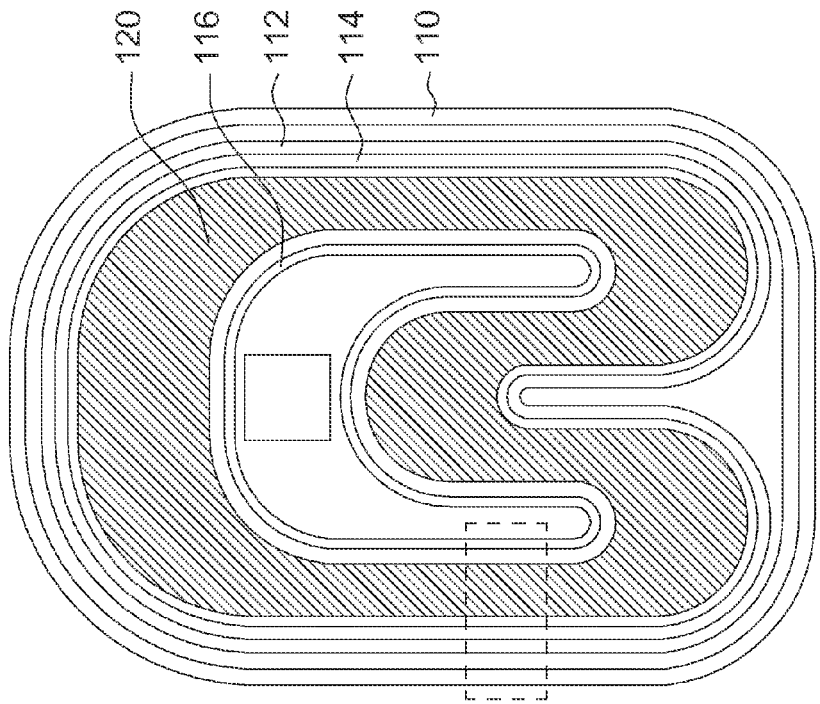
FIG. 2 illustrates a top view of a semiconductor structure according to one embodiment.
Figure 1:
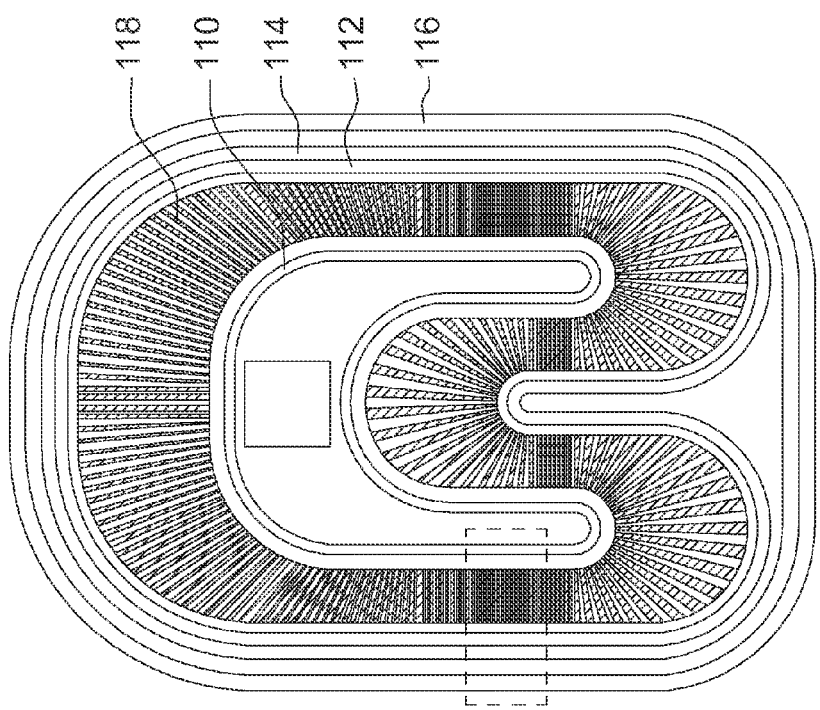
FIG. 1 illustrates a top view of a semiconductor structure according to one embodiment.
Figure 3:
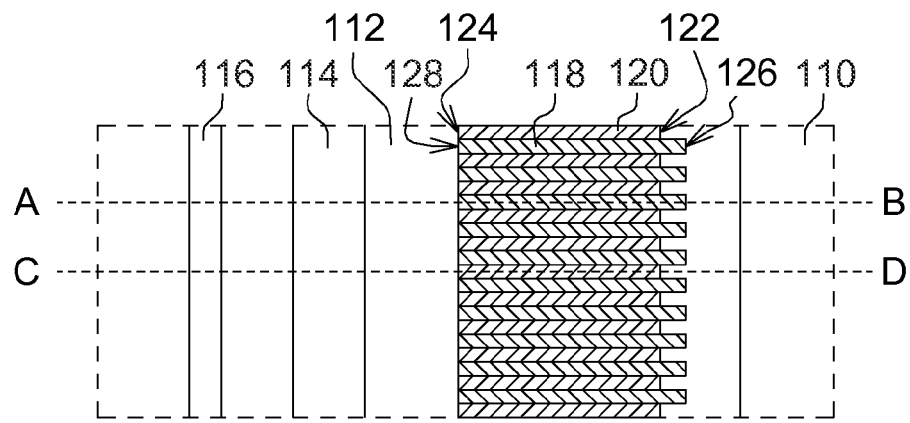
FIG. 3 illustrates a top view of a semiconductor structure according to one embodiment.
Figure 4A:
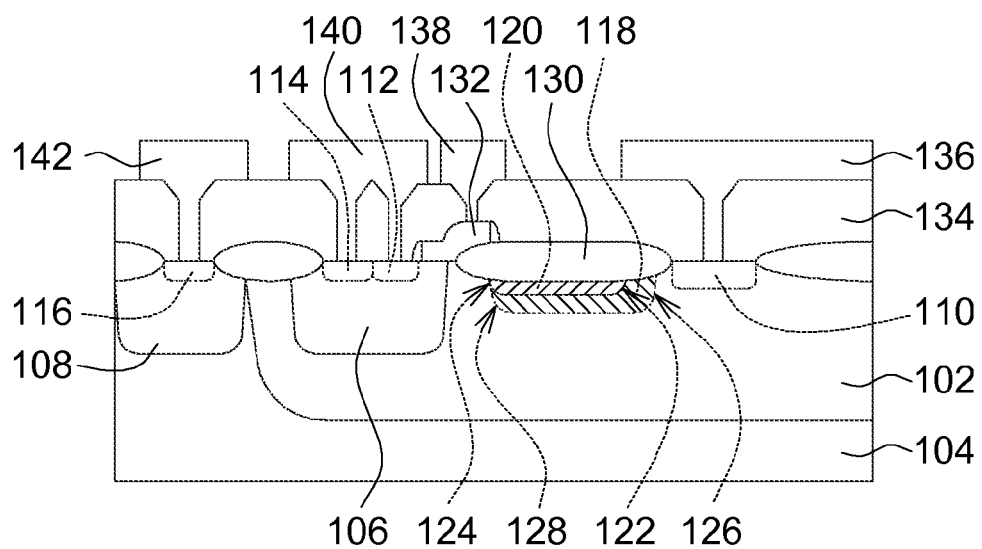
FIG. 4A illustrates a cross-section view of a semiconductor structure according to one embodiment.
Figure 4B:
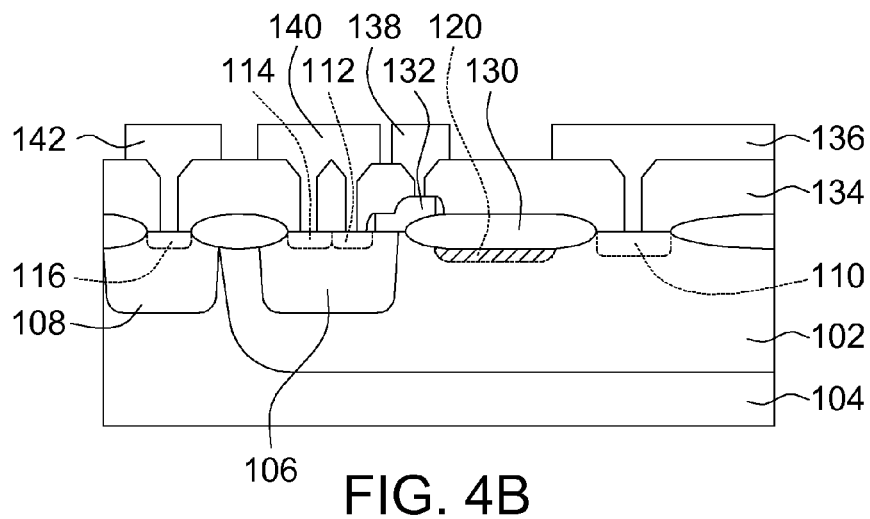
FIG. 4B illustrates a cross-section view of a semiconductor structure according to one embodiment.

FIG. 1 and FIG. 2 illustrate top views of a semiconductor structure according to the first embodiment. FIG. 3 illustrates an enlarged view of a portion, indicated by a dotted line, of the semiconductor structure shown in FIG. 1 and FIG. 2. FIG. 3 shows a doped strip 118, a top doped region 120, a first doped electrode region 110, a second doped electrode region 112, a third doped electrode region 114 and a fourth doped electrode region 116 of the semiconductor structure. FIG. 1 omits the top doped region 120 shown in FIG. 3. FIG. 2 omits the doped strip 118 shown in FIG. 3. FIG. 4A is a cross-section view of the semiconductor structure along AB line in FIG. 3. FIG. 4B is a cross-section view of the semiconductor structure along CD line in FIG. 3.

Referring to FIG. 4A and FIG. 4B, a first doped region 102 is formed in a substrate 104. A second doped region 106 is formed in the first doped region 102. A third doped region 108 is formed in the substrate 104. The first doped electrode region 110 is formed in the first doped region 102. The second doped electrode region 112 and the third doped electrode region 114 are formed in the second doped region 106. The fourth doped electrode region 116 is formed in the third doped region 108. The doped strip 118 is formed in the first doped region 102. Referring to FIG. 4A, the top doped region 120 is formed in the doped strip 118.

Referring to FIG. 3 and FIG. 4A, the top doped region 120 has a first sidewall 122 and a second sidewall 124 opposite to the first sidewall 122. The doped strip 118 has a third sidewall 126 and a fourth sidewall 128 opposite to the third sidewall 126. In this embodiment, the doped strip 118 is extended beyond the first sidewall 122 of the top doped region 120. In other words, the first sidewall 122 of the top doped region 120 is between the third sidewall 126 and the fourth sidewall 128 of the doped strip 118. Referring to FIG. 4A and FIG. 4B, the doped strips 118 are separated from each other by the first doped region 102.

Referring to FIG. 4A and FIG. 4B, an insulating structure 130 is on the top doped region 120. A gate structure 132 is on the second doped region 106 between the first doped region 102 and the second doped electrode region 112. The semiconductor structure comprises a dielectric layer 134, a conductive layer 136 electrically connected to the first doped electrode region 110, a conductive layer 138 electrically connected to the gate structure 132, a conductive layer 140 electrically connected to the second doped electrode region 112 and the third doped electrode region 114, a conductive layer 142 electrically connected to the fourth doped electrode region 116.

In embodiments, the first doped region 102 and the top doped region 120 have a first type conductivity such as N type conductivity. The second doped region 106, the third doped region 108, the third doped electrode region 114, the fourth doped electrode region 116 and the doped strip 118 have a second type conductivity such as P type conductivity, opposite to the first type conductivity.

In one embodiment, the semiconductor structure is a MOS device. In this case, the first doped electrode region 110 and the second doped electrode region 112 have the first type conductivity such as N type conductivity. The first doped electrode region 110 is used as one of a source and a drain of the MOS device. The second doped electrode region 112 is used as the other of the source and the drain of the MOS device. For example, the first doped electrode region 110 is used as the drain, and the second doped electrode region 112 is used as the source.

In another embodiment, the semiconductor structure is an IGBT device. In this case, the first doped electrode region 110 has the second type conductivity such as P type conductivity. The second doped electrode region 112 has the first type conductivity such as N type conductivity. The first doped electrode region 110 is used as one of a source and a drain of the IGBT device. The second doped electrode region 112 is used as the other of the source and the drain of the IGBT device. For example, the first doped electrode region 110 is used as the drain, and the second doped electrode region 112 is used as the source.

FIG. 4A to FIG. 8B illustrate a manufacturing process for the semiconductor structure according to one embodiment. Figures labeled with A illustrate cross-section views of a portion, having the top doped region on the doped strip, of the semiconductor structure, such as cross-section views along AB line in FIG. 3. Figures labeled with B illustrates cross-section views of a portion, having the top doped region on the first doped region extended between the doped strips, of the semiconductor structure, such as cross-section views along CD line in FIG. 3.

Figure 5A:
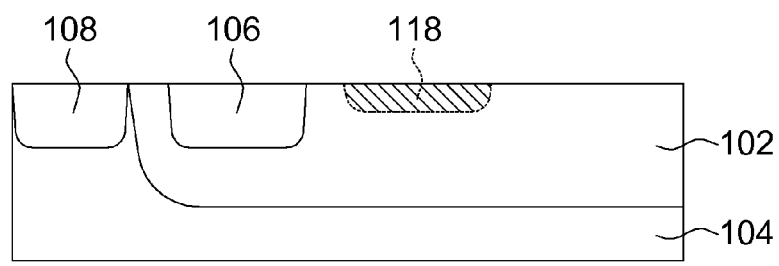
FIG. 5A to FIG. 8B illustrate a manufacturing process for a semiconductor structure according to one embodiment.
Figure 5B:
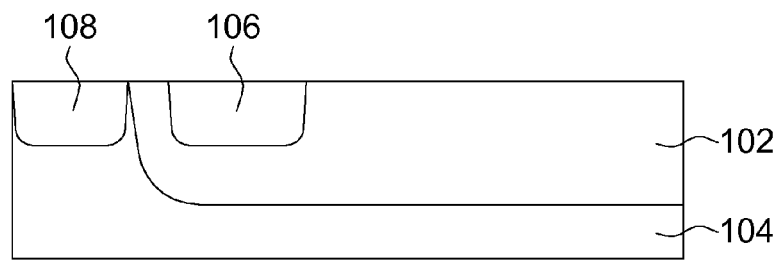

Referring to FIG. 5A and FIG. 5B, the substrate 104, such as a bulk silicon or a SOI, is provided. The first doped region 102 is formed in the substrate 104. The second doped region 106 is formed in the first doped region 102. The third doped region 108 is formed in the substrate 104. In one embodiment, the second doped region 106 and the third doped region 108, both having the second type conductivity such as P type conductivity, are simultaneously formed by using the same mask. Referring to FIG. 5A, the doped strip 118 is formed in the first doped region 102.

Figure 6A:
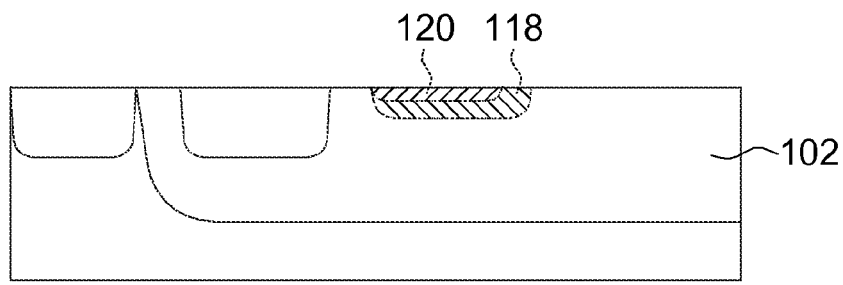
Figure 6B:
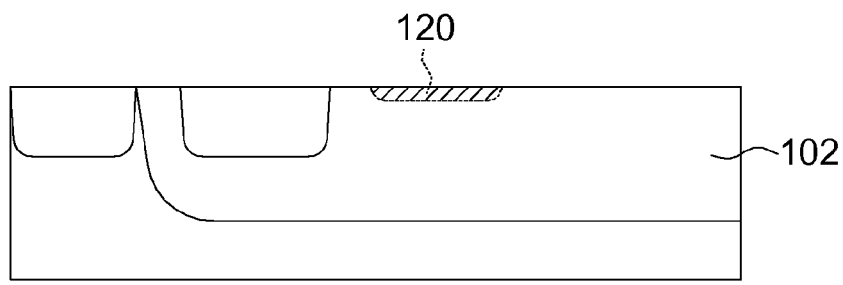

Referring to FIG. 6A and FIG. 6B, the top doped region 120 is formed in the doped strip 118 and the first doped region 102. In embodiments, the top doped region 120 and the doped strip 118 are respectively formed by using different masks.

Figure 7A:
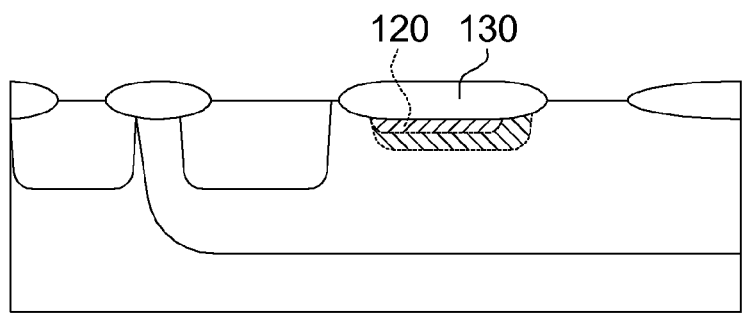
Figure 7B:
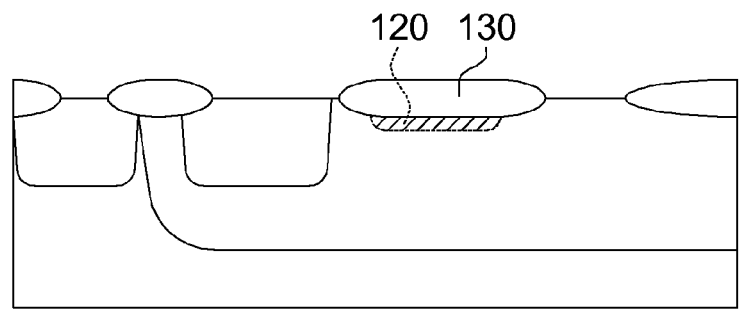

Referring to FIG. 7A and FIG. 7B, the insulating structure 130 is formed on the top doped region 120. The insulating structure 130 is not limited to a FOX as shown in FIG. 7A and FIG. 7B. The insulating structure 130 may comprise a STI or other suitable dielectric structures.

Figure 8A:
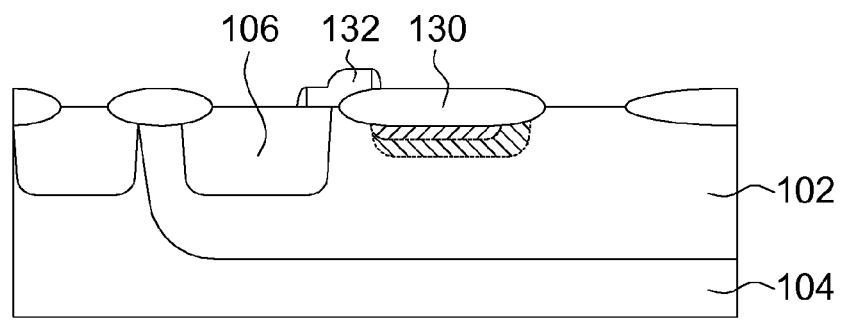
Figure 8B:
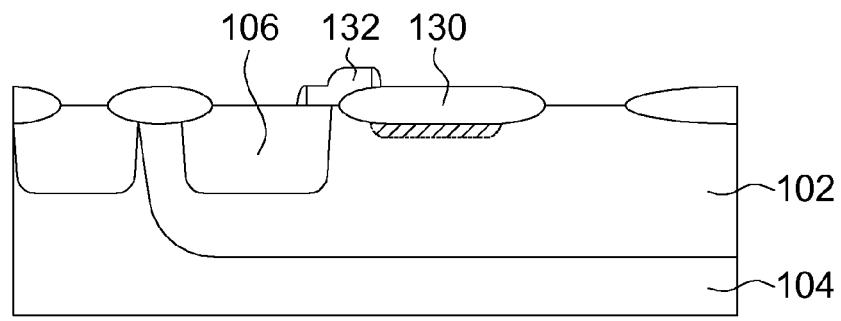

Referring to FIG. 8A and FIG. 8B, the gate structure 132 may be formed on the first doped region 102 and the second doped region 106 ⊥, and extended on the insulating structure 130. The gate structure 132 may comprise a gate dielectric layer, a gate electrode layer and a spacer. The gate electrode layer is formed on the gate dielectric layer. The spacers are formed on opposite sidewalls of the gate dielectric layer and the gate electrode layer. In one embodiment, before forming the gate dielectric layer, a SAC oxide is formed on the surface of the substrate 104, and then the SAC oxide is removed. Therefore, the gate dielectric layer having excellent property can be formed. The gate electrode layer may comprise a polysilicon layer and a metal silicide layer, such as tungsten silicide, formed on the polysilicon layer. The spacer may comprise silicon dioxide such as tetraethoxy silane (TEOS).

Referring to FIG. 4A and FIG. 4B, the first doped electrode region 110 is formed in the first doped region 102. The second doped electrode region 112 is formed in the second doped region 106. The third doped electrode region 114 is formed in the second doped region 106. The fourth doped electrode region 116 is formed in the third doped region 108. In embodiments, the first doped electrode region 110, the second doped electrode region 112, the third doped electrode region 114 and the fourth doped electrode region 116 are formed by a heavy doping.

Referring to FIG. 4A and FIG. 4B, next, the dielectric layer 134 is formed on the substrate 104. The conductive layer 136, the conductive layer 138, the conductive layer 140 and the conductive layer 142 is formed by filling a conductive material into an opening of the dielectric layer 134 and then patterning the conductive material. The conductive layer 136, the conductive layer 138, the conductive layer 140 and the conductive layer 142 comprise a metal such as W, Cu, Al, and so on.

Second Embodiment

Figure 9A:
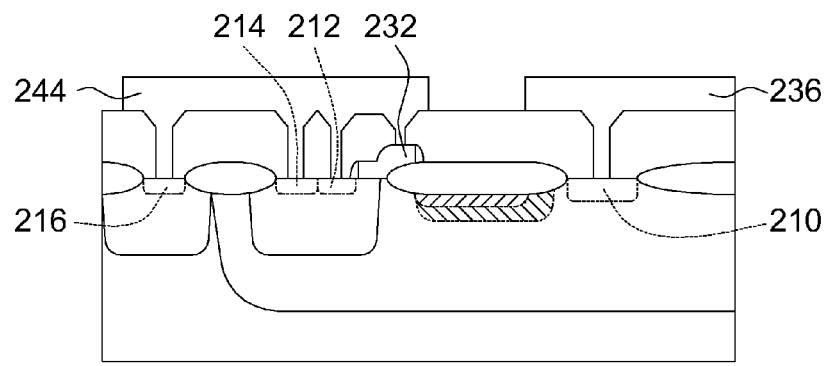
FIG. 9A illustrates a cross-section view of a semiconductor structure according to one embodiment.
Figure 9B:
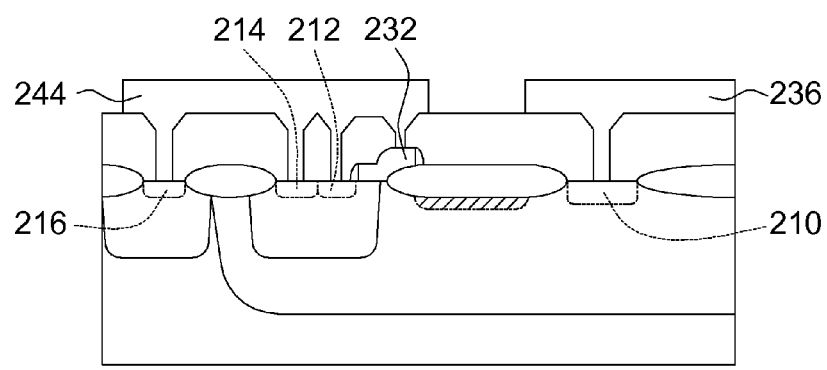
FIG. 9B illustrates a cross-section view of a semiconductor structure according to one embodiment.

FIG. 9A and FIG. 9B illustrate cross-section views of the semiconductor structure of the second embodiment. For example, FIG. 9A is a cross-section view of the semiconductor structure along AB line in FIG. 3. FIG. 9B is a cross-section view of the semiconductor structure along CD line in FIG. 3. The semiconductor structure shown in FIG. 9A and FIG. 9B is different from the semiconductor structure shown in FIG. 4A and FIG. 4B in that the semiconductor structure comprises the conductive layer 236 electrically connected to the first doped electrode region 210, and the conductive layer 244 electrically connected to the gate structure 232, the second doped electrode region 212, the third doped electrode region 214 and the fourth doped electrode region 216. In addition, in one embodiment, the semiconductor structure is a diode device. In this case, the first doped electrode region 210 and the second doped electrode region 212 has the first type conductivity such as N type conductivity. The first doped electrode region 210 is electrically connected to one of an anode and a cathode. The second doped electrode region 212 is electrically connected to the other of the anode and the cathode.

Third Embodiment

Figure 10:
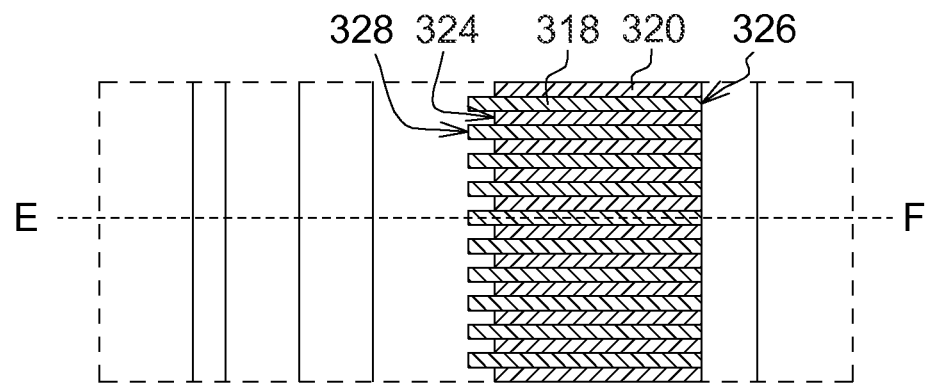
FIG. 10 illustrates a top view of a semiconductor structure according to one embodiment.
Figure 11:
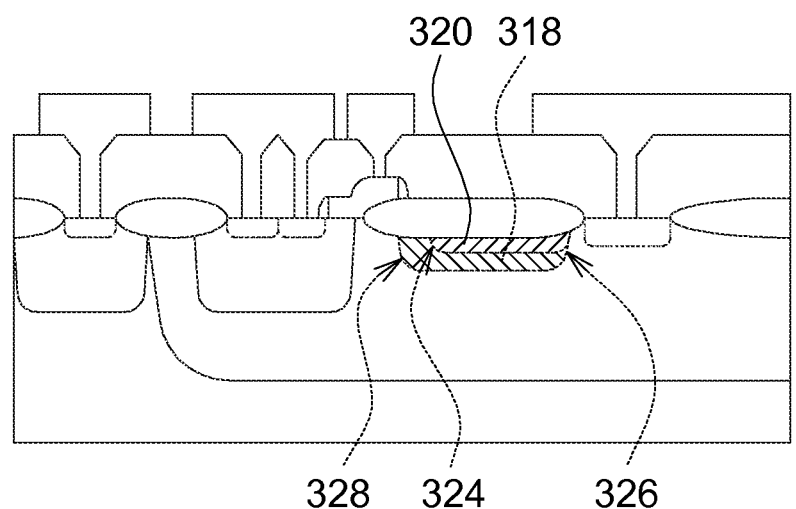
FIG. 11 illustrates a cross-section view of a semiconductor structure according to one embodiment.

FIG. 10 illustrates a top view of the semiconductor structure of the third embodiment. FIG. 11 is a cross-section view of the semiconductor structure along EF line in FIG. 10. The semiconductor structure shown in FIG. 10 and FIG. 11 is different from the semiconductor structure shown in FIG. 3 and FIG. 4A in that the doped strip 318 is extended beyond the second sidewall 324 of the top doped region 320. In other words, the second sidewall 324 of the top doped region 320 is between the third sidewall 326 and the fourth sidewall 328 of the doped strip 318.

Fourth Embodiment

Figure 12:
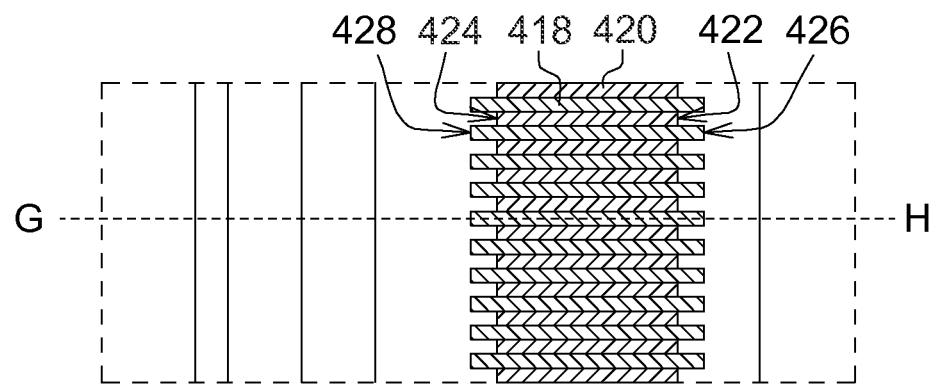
FIG. 12 illustrates a top view of a semiconductor structure according to one embodiment.
Figure 13:
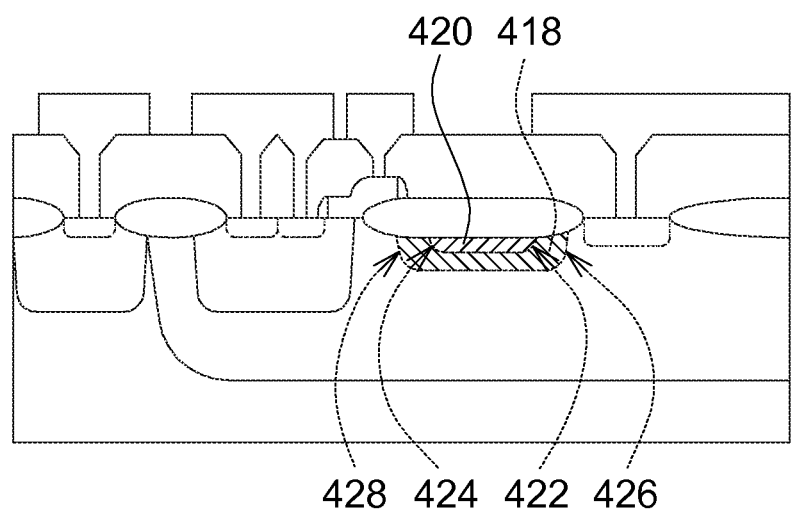
FIG. 13 illustrates a cross-section view of a semiconductor structure according to one embodiment.

FIG. 12 illustrates a top view of the semiconductor structure of the fourth embodiment. FIG. 13 is a cross-section view of the semiconductor structure along GH line in FIG. 12. The semiconductor structure shown in FIG. 12 and FIG. 13 is different from the semiconductor structure shown in FIG. 3 and FIG. 4A in that the doped strip 418 is extended beyond both the first sidewall 422 and the second sidewall 424 of the top doped region 420. In other words, both the first sidewall 422 and the second sidewall 424 of the top doped region 420 are between the third sidewall 426 and the fourth sidewall 428 of the doped strip 418.

Figure 14:
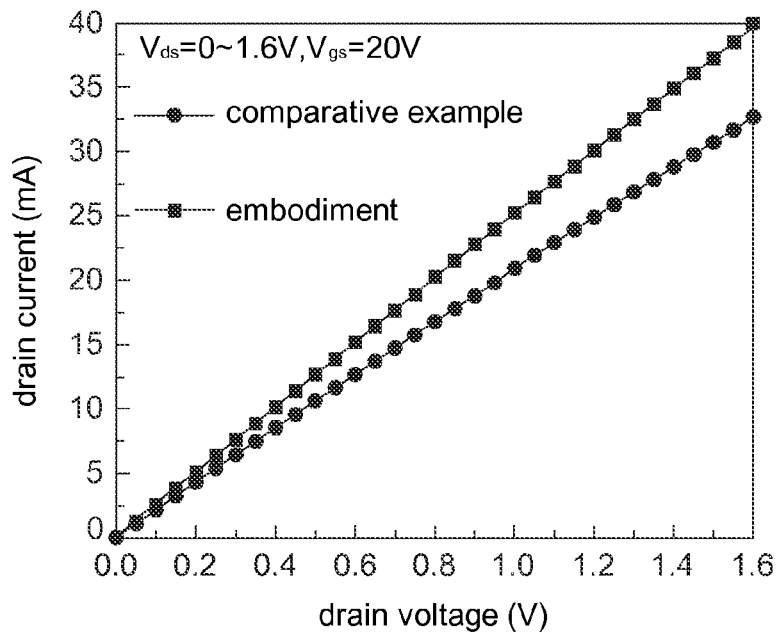
FIG. 14 illustrates I-V curves of semiconductor structures.
Figure 15:
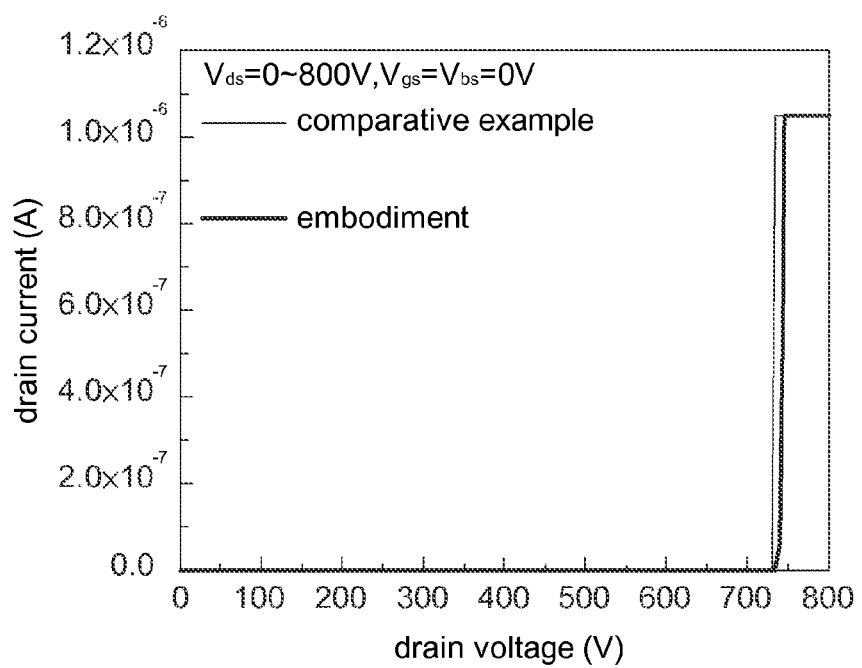
FIG. 15 illustrates I-V curves of semiconductor structures.

In embodiments, the semiconductor structure has the doped strip extended beyond the top doped region. Therefore, the maximum doping for the top doped region can be increased, and the depletion condition can be maintained. In addition, under the same high breakdown voltage, the on-resistance of the device can be decreased, and the on-state current of the device is increased. Thus, the device has a high efficiency. Moreover, the semiconductor structure can be applied for a HV, ultra-HV (such as 300V~1000V) device, such as MOS, IGBT and diode. FIG. 14 and FIG. 15, I-V curves of the semiconductor structure, show that compared with a conventional semiconductor structure (comparative example), the on-state resistance and the current at drain side of the semiconductor structure (ultra-HV LDMOS) in embodiments can be reduced by about 17% and increased by about 20.5% respectively. In addition, the breakdown voltage of the semiconductor structure in embodiments can be kept over 700 V (740V).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first doped region having a first type conductivity;
   a second doped region formed in the first doped region and having a second type conductivity opposite to the first type conductivity;
   a doped strip formed in the first doped region and having the second type conductivity; and
   a top doped region formed in the doped strip and having the first type conductivity, wherein the top doped region has a first sidewall and a second sidewall opposite to the first sidewall, the doped strip is extended beyond the first sidewall or the second sidewall.

2. The semiconductor structure according to claim 1, wherein the doped strip has a third sidewall and a fourth sidewall opposite to the third sidewall, the first sidewall or the second sidewall of the top doped region is between the third sidewall and the fourth sidewall between the doped strip.

3. The semiconductor structure according to claim 1, wherein the doped strip comprises a plurality of the doped strips separated from each other by the first doped region.

4. The semiconductor structure according to claim 1, wherein the top doped region is formed in the first doped region.

5. The semiconductor structure according to claim 1, wherein the doped strip is extended beyond both the first sidewall and the second sidewall.

6. The semiconductor structure according to claim 1, further comprising:
   a first doped electrode region formed in the first doped region; and
   a second doped electrode region formed in the second doped region.

7. The semiconductor structure according to claim 6, wherein the first doped electrode region and the second doped electrode region have the first type conductivity.

8. The semiconductor structure according to claim 7, further comprising a gate structure on the second doped region between the first doped region and the second doped electrode region.

9. The semiconductor structure according to claim 8, wherein the semiconductor structure is a MOS device, the first doped electrode region is used as one of a source or a drain of the MOS device, the second doped electrode region is used as the other of the source and the drain of the MOS device.

10. The semiconductor structure according to claim 7, wherein the semiconductor structure is a diode device, the first doped electrode region is electrically connected to one of an anode and a cathode, the second doped electrode region is electrically connected to the other of the anode and the cathode.

11. The semiconductor structure according to claim 6, wherein the first doped electrode region has the second type conductivity, the second doped electrode region has the first type conductivity.

12. The semiconductor structure according to claim 11, further comprising a gate structure on the second doped region between the first doped region and the second doped electrode region.

13. The semiconductor structure according to claim 12, wherein the semiconductor structure is an IGBT device, the first doped electrode region is used as a source and a drain of the IGBT device, the second doped electrode region is used as the other of the source and the drain of the IGBT device.

14. The semiconductor structure according to claim 1, further comprising an insulating structure on the top doped region.

15. The semiconductor structure according to claim 1, wherein the first type conductivity is N type conductivity, the second type conductivity is P type conductivity.

* * * * *